(12) United States Patent
Wang et al.

(10) Patent No.: US 7,808,847 B2
(45) Date of Patent: Oct. 5, 2010

(54) MEMORY REPAIR CIRCUIT AND REPAIRABLE PSEUDO-DUAL PORT STATIC RANDOM ACCESS MEMORY

(75) Inventors: Szu-Mien Wang, Tai Pei (TW); Dan-Chi Yang, Hsin Chu (TW)

(73) Assignee: Orise Technology Co., Ltd., Hsinchu (TW)

( * ) Notice: Subject to any disclaimer, the term of this patent is extended or adjusted under 35 U.S.C. 154(b) by 117 days.

(21) Appl. No.: 12/344,884

(22) Filed: Dec. 29, 2008

(65) Prior Publication Data

US 2010/0014367 A1    Jan. 21, 2010

(30) Foreign Application Priority Data

Jul. 21, 2008    (TW) .............................. 97127564 A

(51) Int. Cl.
*G11C 7/00* (2006.01)

(52) U.S. Cl. .............. 365/200; 365/230.02; 365/230.03; 365/230.06

(58) Field of Classification Search ................. 365/200, 365/230.02, 230.05–230.06, 230.03, 230.08
See application file for complete search history.

(56) References Cited

U.S. PATENT DOCUMENTS

| | | | |
|---|---|---|---|
| 5,257,229 A | 10/1993 | McClure et al. | |
| 7,173,867 B2 | 2/2007 | Terzioglu | |
| 7,590,015 B2 * | 9/2009 | Kodaira et al. | ............... 365/200 |

* cited by examiner

*Primary Examiner*—David Lam
(74) *Attorney, Agent, or Firm*—Muncy, Geissler, Olds & Lowe, PLLC

(57) ABSTRACT

The present invention relates to a memory repair circuit and a repairable pseudo-dual port static random access memory (pseudo-dual port SRAM). The memory repair circuit uses fewer redundant column blocks and stores a few failed block addresses to reduce the required complexity of decoding the redundant column blocks. Thus, the present invention can reduce a layout area required by redundant memory cells.

10 Claims, 3 Drawing Sheets

MEMORY REPAIR CIRCUIT AND REPAIRABLE PSEUDO-DUAL PORT STATIC RANDOM ACCESS MEMORY

This application claims priority of No. 097127564 filed in Taiwan R.O.C. on Jul. 21, 2008 under 35 USC 119, the entire content of which is hereby incorporated by reference.

BACKGROUND OF THE INVENTION

1. Field of Invention

The present invention relates in general to the memory repair technology, and more particularly to a repairable pseudo-dual port static random access memory.

2. Related Art

Recently, the flourishing development of the electronic industry and the rapid progress of the associated electronic technology continuously reduce the scale of the manufacturing process of the memory. A static random access memory (SRAM) is the embedded memory device, which is widely used in the very-large-scale integration (VLSI) field. With the progress of the manufacturing process, the area of the memory cell of the current single static random access memory has been smaller than 2 $\mu m^2$ in the 0.13 μm manufacturing process and has reached about 1 $\mu m^2$ in the 90 nm manufacturing process. This means that an extremely small particle may cause the bit failure of the static random access memory.

In the application of the panel driving integrated circuit, the resolution of the panel is continuously increased, and the capacity and the area of the static random access memory to be built in are also increased. When the total area of the static random access memory is increased, its single bit memory cell area is reduced. In the same panel driving integrated circuit, the opportunity of the appearance of the bit failure due to the manufacturing process or particles is gradually increased. Thus, the overall panel driving circuit often becomes a failed die only due to the bit failure of the static random access memory, and the influence of the production yield becomes more and more obvious.

In order to overcome the bit failure of the static random access memory and increase the yield, the repair mechanism of the static random access memory becomes very important. In the repair mechanism, it is a difficult issue for the integrated circuit designer to design redundant memory cells and to automatically replace the failed bit. In the prior art, several techniques are used to repair the memory defects, as disclosed in U.S. Pat. Nos. 5,257,229 and 7,173,867 B2.

The '229 is directed to the static random access memory with the single port and the repair is made using the redundant row. In order to utilize the redundant row more efficiently, each redundant row may be mapped to any row position for repair in the '229 patent. However, this technology is designed for the repair of the column address of the single-port static random access memory, but cannot be applied to the repair of the failed bit of the dual-port static random access memory because the data buses of the two ports have different bandwidths. In addition, each redundant row in this technology can be applied to repair any row so that the efficiency seems very high. In the static random access memory, however, many select circuits for the redundant rows and the corresponding fuses are needed. Therefore, it is not practical if this technology is applied to the dual-port static random access memory.

The '867 patent is to partition the memory with the very high density. The memory is partitioned into small blocks, which may work rapidly, by global/local bit lines and global/local word lines. Thereafter, the redundant row or column is placed in each small block to serve as the repair mechanism. The drawback of this technology is similar to the previous technology. Although the memory is divided into many small blocks and each small block has its own redundant row or redundant column for repair, this method needs to store a lot of failed bit addresses. Thus, the decoding scheme of the redundant column using this technology cannot be easily applied to the memory on the driving circuit of the liquid crystal display panel.

Because the driving circuit of the liquid crystal display panel needs the dual-port static random access memories with different bandwidths, the typical memory repair technology is mainly applied to the single-port static random access memory. When the repair technology has to be applied to the non-symmetrical dual-port static random access memory (e.g., the driving circuit of the liquid crystal display), the automatic repair circuit and the layout arrangement represented thereby cannot be efficiently used in non-symmetrical two ports in the prior art.

SUMMARY OF THE INVENTION

It is therefore an objective of the present invention to provide a repairable pseudo-dual port static random access memory to be applied to a non-symmetrical dual-port static random access memory.

Another objective of the present invention is to provide a repairable pseudo-dual port static random access memory and a repair circuit of the pseudo-dual port static random access memory in order to reduce a layout area for redundant memory cells and the complexity of decoding the redundant memory cells.

The present invention achieves the above-identified or other objectives by providing a repairable pseudo-dual port static random access memory, which includes a memory cell array, an address decoding circuit, a first input-output port, a second input-output port, a first select circuit and a second select circuit. The memory cell array includes a plurality of memory cell blocks and a redundant block. Each of the memory cell blocks is divided into a plurality of memory cell sub-blocks. A size of the redundant block is the same as a size of the memory cell sub-blocks. The address decoding circuit includes a row address decoding circuit, a first column address decoding circuit and a second column address decoding circuit. The row address decoding circuit is for turning on a specific row of the memory cell array according to the specific row specified by a row address. The first column address decoding circuit has an N-bit connection bus and is for electrically connecting N first specific columns of the memory cell array to the N-bit connection bus of the first column address decoding circuit according to the N first specific columns specified by a first column address signal. The second column address decoding circuit has an M-bit connection bus and is for electrically connecting M second specific columns of the memory cell array to the M-bit connection bus of the second column address decoding circuit according to the M second specific columns specified by a second column address signal. The first input-output port has an N-bit bus. The second input-output port has an M-bit bus. The first select circuit is coupled to the N-bit connection bus of the first column address decoding circuit and the N-bit bus of the first input-output port. The second select circuit is coupled to the M-bit connection bus of the second column address decoding circuit and the M-bit bus of the second input-output port. When a first specific column specified by the first column address signal is in a failed memory cell sub-block, the first select circuit selects a first corresponding column of the redundant block, and connects the first corresponding column of the redundant block to the N-bit bus of the first input-output port. A relative address of the first corresponding column is the same as an address of the first specific column in the failed memory cell sub-block. When a second specific column specified by the second column address signal is in the failed memory cell sub-block, the second select circuit selects a second corresponding column of the redundant block, and couples the second corresponding column of the redundant block to the M-bit bus of the second input-output port. A relative address of the second corresponding column is the same as an address of the second specific column in the failed memory cell sub-block. M and N are natural numbers, and M>N.

The present invention additionally provides a repair circuit of a pseudo-dual port static random access memory. The pseudo-dual port static random access memory includes a memory cell array, an address decoding circuit, a first input-output port and a second input-output port. The memory cell array includes a plurality of memory cell blocks. Each of the memory cell blocks is divided into a plurality of memory cell sub-blocks. The address decoding circuit includes a row address decoding circuit, a first column address decoding circuit and a second column address decoding circuit. The row address decoding circuit is for turning on a specific row of the memory cell array according to the specific row specified by a row address. The first column address decoding circuit has an N-bit connection bus and is for electrically connecting N first specific columns of the memory cell array to the N-bit connection bus of the first column address decoding circuit according to the N first specific columns specified by a first column address signal. The second column address decoding circuit has an M-bit connection bus and is for electrically connecting M second specific columns of the memory cell array to the M-bit connection bus of the second column address decoding circuit according to the M second specific columns specified by a second column address signal. The first input-output port has an N-bit bus. The second input-output port has an M-bit bus. In addition, the memory repair circuit includes a redundant block, a first select circuit and a second select circuit. The redundant block is disposed in the memory cell array. A size of the redundant block is the same as a size of the memory cell sub-blocks. The first select circuit is coupled to the N-bit connection bus of the first column address decoding circuit and the N-bit bus of the first input-output port. The second select circuit is coupled to the M-bit connection bus of the second column address decoding circuit and the M-bit bus of the second input-output port. When a first specific column specified by the first column address signal is in a failed memory cell sub-block, the first select circuit selects a first corresponding column of the redundant block, and connects the first corresponding column of the redundant block to the N-bit bus of the first input-output port. A relative address of the first corresponding column is the same as an address of the first specific column in the failed memory cell sub-block. When a second specific column specified by the second column address signal is in the failed memory cell sub-block, the second select circuit selects a second corresponding column of the redundant block, and couples the second corresponding column of the redundant block to the M-bit bus of the second input-output port. A relative address of the second corresponding column is the same as an address of the second specific column in the failed memory cell sub-block. M and N are natural numbers, and M>N.

In the memory repair circuit and the pseudo-dual port static random access memory according to the preferred embodiment of the present invention, the memory cell array includes "a" memory cell blocks each including "b" sub-memory cell blocks, each of which includes "c" column addresses. The first column address decoding circuit includes a×b first multiplexers and "a" second multiplexers. Each of the first multiplexers includes "c" input terminals and "d" output terminals, wherein the "c" input terminals of the $(i \times j)^{th}$ first multiplexer are respectively coupled to the "c" column addresses of the $j^{th}$ memory cell sub-block of the $i^{th}$ memory cell block. Each of the second multiplexers includes b×d input terminals and "d" output terminals, wherein the $(p \times 1)^{th}$ to $(p \times d)^{th}$ input terminals of the $k^{th}$ second multiplexer are respectively coupled to the first to $d^{th}$ output terminals of the $(k \times p)^{th}$ first multiplexer, wherein "a", "b", "c", "d", "i", "j", "k" and "p" are natural numbers; d×a=N; "i" and "k" range between 0 and "a"; "j" and "p" range between 0 and "b". Each of the first multiplexers selects "d" column addresses according to a first portion of the first column address signal so that the "d" column addresses are electrically connected to the "d" output terminals thereof. Each of the second multiplexers selects a specific multiplexer from the "b" multiplexers coupled thereto according to a second portion of the first column address signal, and electrically connects the "d" output terminals of the specific multiplexer to the "d" output terminals thereof.

In addition, according to the design of the preferred embodiment, the redundant block includes "c" column addresses, and the first select circuit includes a third multiplexer, "a" fourth multiplexers and a first control circuit. The third multiplexer includes "c" input terminals and "d" output terminals. The "c" input terminals of the third multiplexer are respectively coupled to the "c" column addresses of the redundant block, and the third multiplexer selects "d" column addresses according to the first portion of the first column address signal so that the "d" column addresses are electrically connected to the "d" output terminals thereof. Each of the fourth multiplexers includes a control input terminal, a first set of input terminals, a second set of input terminals and "d" output terminals. The first set of input terminals and the second set of input terminals of the fourth multiplexer respectively include "d" input terminals. The first set of input terminals of the $u^{th}$ fourth multiplexer is coupled to the "d" output terminals of the $u^{th}$ second multiplexer. The second set of input terminals of each of the fourth multiplexers is coupled to the "d" output terminals of the third multiplexer. The first control circuit includes "a" control output terminals respectively coupled to the control input terminals of the fourth multiplexer. When the first specific column specified by the first column address signal is in the $y^{th}$ memory cell sub-block of the $v^{th}$ memory cell block and the $y^{th}$ memory cell sub-block of the $v^{th}$ memory cell block is the failed memory cell sub-block, the $v^{th}$ control output terminal of the first control circuit controls the $v^{th}$ fourth multiplexer so that the second set of input terminals of the $v^{th}$ fourth multiplexer is electrically connected to the "d" output terminals thereof, wherein "v" and "y" are natural numbers, and "v" ranges between 0 and "a", and "y" ranges between 0 and "b".

The spirit of the present invention is to utilize the redundant block to repair the failed bit, which may appear in the pseudo-dual port static random access memory having two input-output ports with different bandwidths in the driving circuit of the liquid crystal display. The present invention may utilize the fewer redundant column blocks and store a few failed block addresses to reduce the complexity of decoding the redundant block required in the redundant column block. Thus, the present invention can reduce the layout area for the redundant memory cells.

Further scope of the applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus are not limitative of the present invention.

DETAILED DESCRIPTION OF THE INVENTION

The present invention will be apparent from the following detailed description, which proceeds with reference to the accompanying drawings, wherein the same references relate to the same elements.

Figure 1:
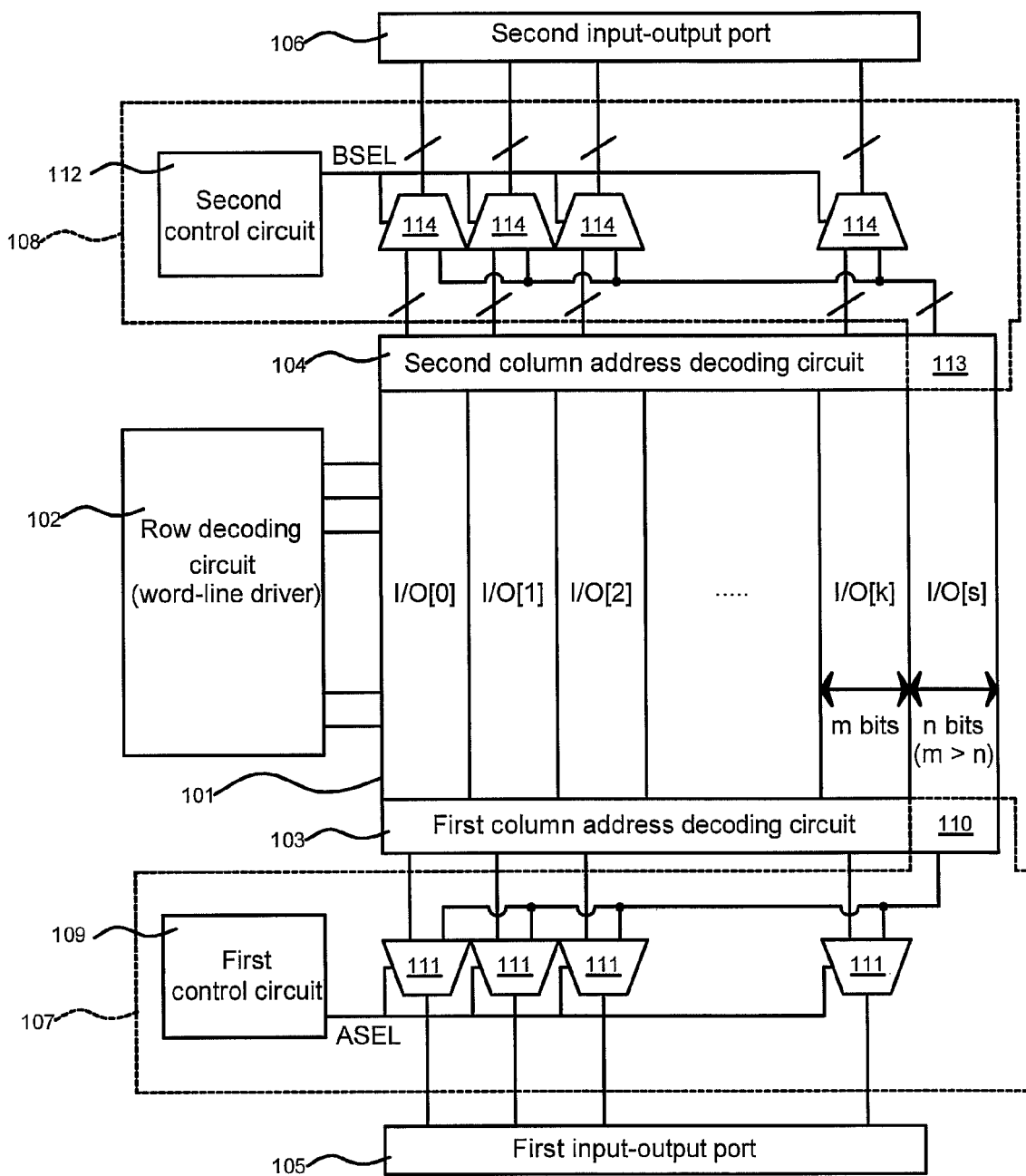
FIG. 1 is a circuit block diagram showing a pseudo-dual port static random access memory according to an embodiment of the present invention.

FIG. 1 is a circuit block diagram showing a pseudo-dual port static random access memory according to an embodiment of the present invention. Referring to FIG. 1, the pseudo-dual port static random access memory includes a memory cell array 101, a row address decoding circuit 102, a first column address decoding circuit 103, a second column address decoding circuit 104, a first input-output port 105, a second input-output port 106, a first select circuit 107 and a second select circuit 108.

The memory cell array 101 includes a plurality of memory cell blocks I/O[0] to I/O[k] and a redundant block I/O[s], wherein a column bit number n of the redundant block I/O[s] is smaller than a bit number m of each of the memory cell blocks I/O[0] to I/O[k]. The first select circuit 107 includes a first control circuit 109, a multiplexer 110 disposed in the first column address decoding circuit 103, and a plurality of multiplexers 111. The second select circuit 108 includes a second control circuit 112, a multiplexer 113 disposed in the second column address decoding circuit 104, and a plurality of multiplexers 114.

In this embodiment, the memory cell of the memory cell array 101 is the conventional SRAM cell composed of six transistors. However, its bit line is coupled to two different column address decoding circuits 103 and 104 to construct the pseudo-dual port static random access memory. Because the pseudo-dual port static random access memory is not the real dual-port static random access memory, the memory cell array 101 is shared. So, the first input-output port 105 and the second input-output port 106 cannot be simultaneously accessed. Generally speaking, the pseudo-dual port static random access memory accesses the memory cell array 101 through the first input-output port 105 and the second input-output port 106 with different time intervals.

Current fabrication technology shows that the probability of having bit failures in more than two different blocks is relatively low. In order to overcome the bit failure of the static random access memory cell in this embodiment, each of the memory cell blocks I/O[0] to I/O[k] is divided into a plurality of sub-blocks, and the column bit number n of the redundant block I/O[s] is the same as the column bit number n of the sub-blocks. That is, the column number or the memory cell number of the redundant block is the same as the column number or the memory cell number of the sub-blocks. When the sub-block has one or more bit failure, the column address represented by the sub-block may be written into the first control circuit 109 and the second control circuit 112. Thereafter, as long as a command for enabling the input-output port 105 or 106 to access the failed sub-block is received, the first control circuit 109 or the second control circuit 112 can electrically connect the input-output port 105 or 106 to the redundant block I/O[s] by controlling the multiplexer 111 or 114. In order to describe the present invention more clearly, a detailed circuit will be illustrated according to the circuit of FIG. 1 so that one of ordinary skill in the art can implement the present invention according to the spirit of the present invention.

Figure 2:
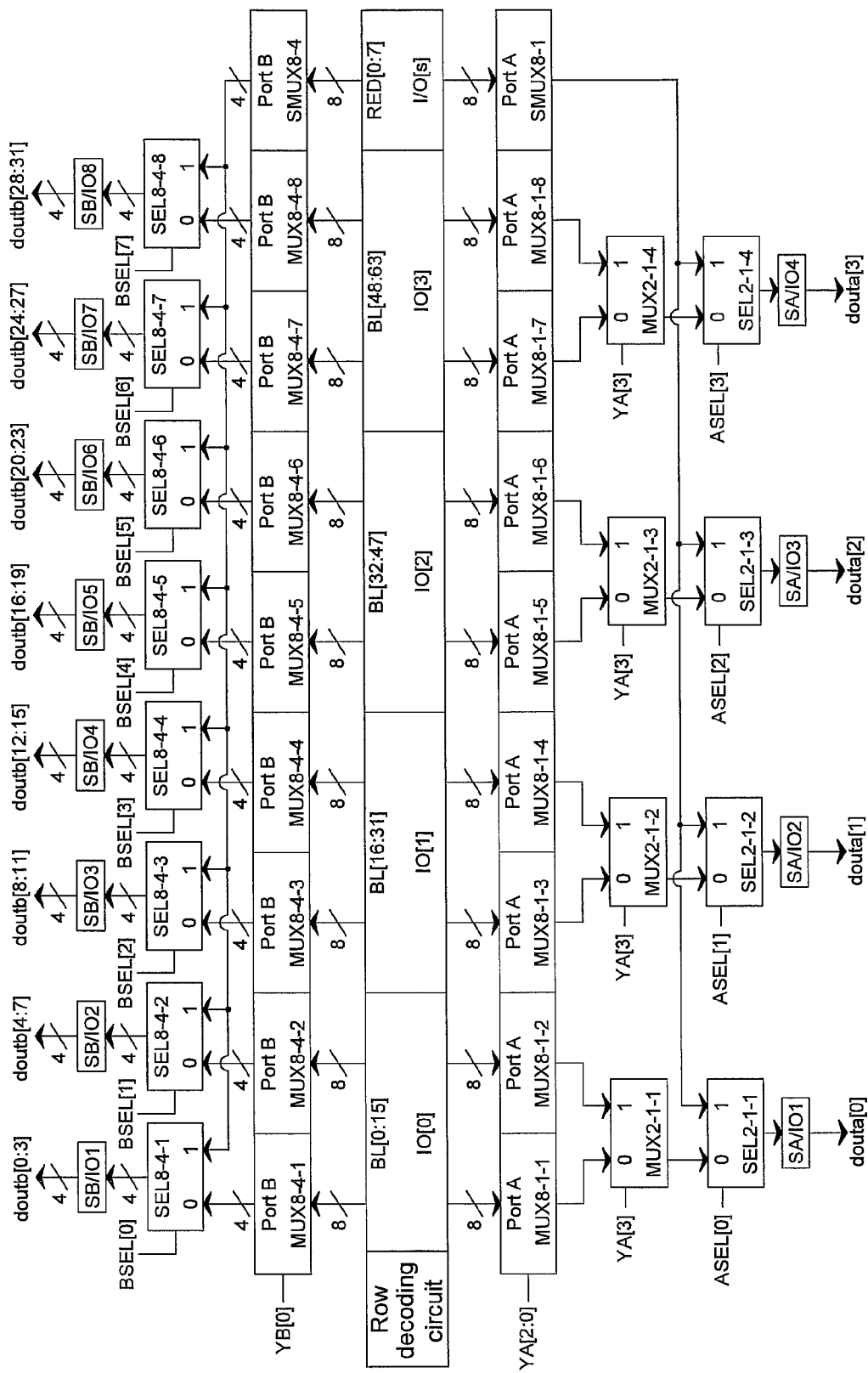
FIG. 2 is a circuit block diagram showing the pseudo-dual port static random access memory of FIG. 1 according to the embodiment of the present invention.

FIG. 2 is a circuit block diagram showing the pseudo-dual port static random access memory of FIG. 1 according to the embodiment of the present invention. As shown in FIG. 2, in order to describe the spirit of the present invention more clearly, four memory cell blocks I/O[0] to I/O[3] will be illustrated in this embodiment, wherein each of the memory cell blocks I/O[0] to I/O[3] has 16 bits of column addresses (bit lines) BL[0:15], BL[16:31], BL[32:47], BL[48:63], the bandwidth of the first input-output port 105 is equal to four bits douta[0] to douta[3], and the bandwidth of the second input-output port 106 is equal to 32 bits doutb[0:3] to doutb[28:31]. In addition, the redundant block I/O[s] has eight bits of column addresses (bit lines) RED[0:7] in this embodiment. The first column address decoding circuit 103 is implemented by eight eight-to-one multiplexers MUX8-1-1 to MUX8-1-8 and four two-to-one multiplexers MUX2-1-1 to MUX2-1-4. The second column address decoding circuit 104 is implemented by eight eight-to-four multiplexers MUX8-4-1 to MUX8-4-8. The first select circuit 107 is implemented by an eight-to-one multiplexer SMUX8-1 and four two-to-one multiplexers SEL2-1-1 to SEL2-1-4. The second select circuit 108 is implemented by eight eight-to-four multiplexers SEL8-4-1 to SEL8-4-8.

According to the circuit structure, one of ordinary skill in the art may easily understand that the design of the memory circuit is to divide each of the memory cell blocks I/O[0] to I/O[3] into two memory cell sub-blocks according to the arrangements of the multiplexers of the first column address decoding circuit 103 and the second column address decoding circuit 104. Each of the memory cell sub-blocks includes eight column addresses (bit lines). For example, the bit lines BL[0:7] of the first memory cell block I/O[0] are coupled to the first eight-to-four multiplexer MUX8-4-1 and the first eight-to-one multiplexer MUX8-1-1, and the bit lines BL[7:15] are coupled to the second eight-to-four multiplexer MUX8-4-2 and the second eight-to-one multiplexer MUX8-1-2.

Each of the eight-to-one multiplexers MUX8-1-1 to MUX8-1-8 selects one selected column address from eight column addresses of the memory cell sub-blocks of the memory cell blocks I/O[0] to I/O[3] according to a least significant bit (LSB) portion YA[2:0] of the column address signal of the first input-output port 105. In addition, the two-to-one multiplexers MUX2-1-1 to MUX2-1-4 select one output terminal electrically connected to the two-to-one multiplexers MUX2-1-1 to MUX2-1-4 from the output terminals of the two eight-to-one multiplexers MUX8-1-1 to MUX8-1-8 coupled thereto according to a most significant bit (MSB) portion YA[3] of the column address signal of the first input-output port 105. In addition, each of the eight-to-four multiplexers MUX8-4-1 to MUX8-4-8 selects four selected column addresses from eight column addresses of the memory cell sub-blocks of the memory cell blocks I/O[0] to I/O[3] according to the column address signal YB[0] of the second input-output port 106.

If the memory cell blocks I/O[0] to I/O[3] of the pseudo-dual port static random access memory do not fail, the two-to-one multiplexers SEL2-1-1 to SEL2-1-4 directly electrically connect the bus pins SA/IO1 to SA/IO4 of the first input-output port 105 to the input terminals thereof labeled as "0" so that they are electrically connected to the two-to-one multiplexers MUX2-1-1 to MUX2-1-4. Similarly, the eight-to-four multiplexers SEL8-4-1 to SEL8-4-8 directly electrically connect the bus pins SB/IO1 to SB/IO8 of the second input-output port 106 to the input buses labeled as "0" so that they are electrically connected to the eight-to-four multiplexers MUX8-4-1 to MUX8-4-8.

Next, if it is found that a failed bit occurs within the range of the 16$^{th}$ to 23$^{rd}$ bit lines BL[16:23] during the manufacturing test, the repair mechanism may be adopted. Thus, when the most significant bit portion YA[3] of the column address signal of the first input-output port 105 is 0, the control signal ASEL[1] is 1. In addition, the control signal BSEL[2] is configured to be 1. Thus, when the addresses of the 16$^{th}$ to 23$^{rd}$ bit lines BL[16:23] are accessed either through the first input-output port 105 or the second input-output port 106, they are forced to be electrically connected to the redundant block I/O[s]. Furthermore, the eight-to-one multiplexer SMUX8-1 coupled to the redundant block I/O[s] receives the least significant bit portion YA[2:0] of the column address signal of the first input-output port 105, the eight-to-four multiplexer SMUX8-4 coupled to the redundant block I/O[s] receives the column address signal YB[0] of the second input-output port 106. Thus, its selected column addresses (bit lines) should be the same as the relative address of the bit lines of the selected sub-block (16$^{th}$ to 23$^{rd}$ bit lines BL[16:23]). Thus, the redundant block I/O[s] may be utilized to replace the sector (16$^{th}$ to 23$^{rd}$ bit lines BL[16:23]) having the failed bit.

In the embodiment of FIG. 2, the circuit for outputting the control signals ASEL[0] to ASEL[3] and BSEL[0] to BSEL[7] is not depicted. In the following, the control circuit with two sets of control signals ASEL[0] to ASEL[3] and BSEL[0] to BSEL[7] according to the embodiment will be illustrated so that one of ordinary skill in the art may implement the present invention according to the spirit of the present invention.

Figure 3:
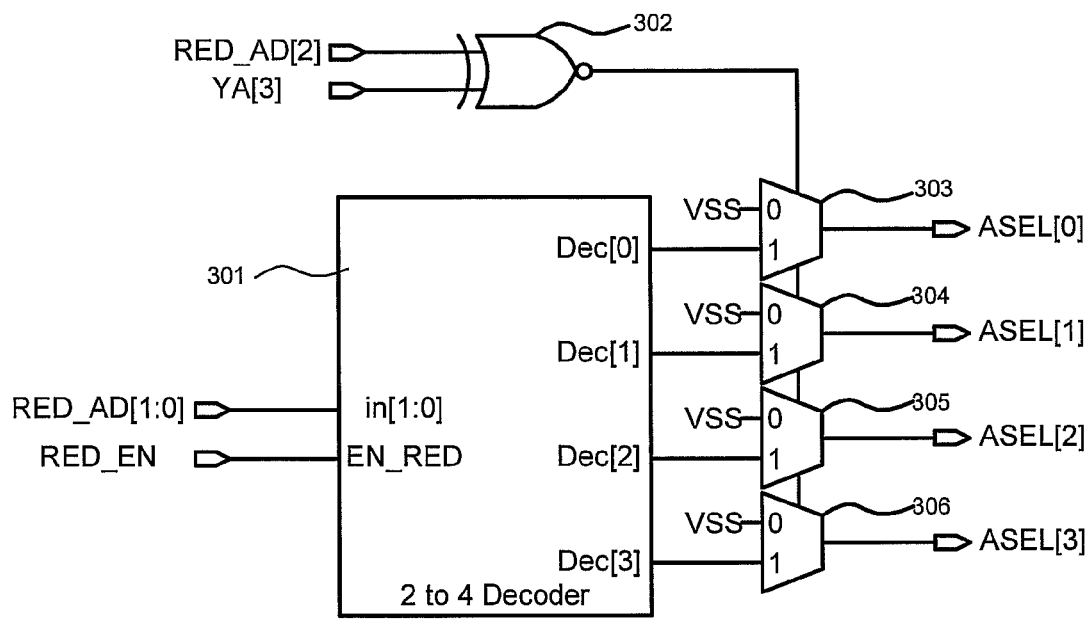
FIG. 3 is a circuit diagram showing a control circuit for outputting control signals ASEL[0] to ASEL[3] according to the embodiment of the present invention.

FIG. 3 is a circuit diagram showing a control circuit for outputting control signals ASEL[0] to ASEL[3] according to the embodiment of the present invention. Referring to FIG. 3, the control circuit includes a two-to-four decoding circuit 301, an XOR gate 302 and four multiplexers 303 to 306. The two-to-four decoding circuit 301 includes two input pins in[1:0], an enable pin RED_EN and four decoding pins Dec[0] to Dec[3]. In order to describe the operation of the control circuit according to the embodiment of the present invention simply, it is also assumed that a failed bit exists within the range of the 16$^{th}$ to 23$^{rd}$ bit lines BL[16:23]. Next, in this embodiment, the sub-block of each memory cell block is defined by an address number, wherein the address number of the bit lines BL[0:7] of the memory cell block IO[0] is defined as 100; the address number of the bit lines BL[7:15] of the memory cell block IO[0] is defined as the address 000; the address number of the bit lines BL[16:23] of the memory cell block IO[1] is defined as the address 101; the address number of the bit lines BL[24:31] of the memory cell block IO[1] is defined as the address 001; the address number of the bit lines BL[32:39] of the memory cell block IO[2] is defined as the address 110; the address number of the bit lines BL[39:47] of the memory cell block IO[2] is defined as the address 010; the address number of the bit lines BL[48:53] of the memory cell block IO[3] is defined as the address 111; and the address number of the bit lines BL[54:63] of the memory cell block IO[3] is defined as the address 011.

The block with the failed bit is the first sub-block of the memory cell block IO[1], that is, the bit lines BL[16:23], and RED_AD[2:0] represents the address of the failed memory cell sub-block. Thus, when BL[16:23] are tested to have the failed bit, the failed block address number RED_AD[2:0] is set as 101, that is, RED_AD[2] is 1 and RED_AD[1:0] is 01. In addition, when a failed bit is found in the test, the failed bit enable signal RED_EN is set as enabled, and the input terminal of the decoding circuit 301 receives 01 so that the decoding pin Dec[1] outputs the logic high voltage. In addition, when the most significant bit portion YA[3] of the column address signal of the first input-output port 105 is 0, the XOR gate 302 outputs the logic high voltage so that the multiplexers 303 to 306 select Dec[0] to Dec[3] as the control signals ASEL[0] to ASEL[3], and ASEL[1] is kept at the logic high voltage. Because ASEL[1] has the logic high voltage, the bus pin SA/IO2 of the first input-output port 105 is electrically connected to the eight-to-one multiplexer SMUX8-1, connected to the redundant block, through the two-to-one multiplexer SEL2-1-2.

Figure 4:
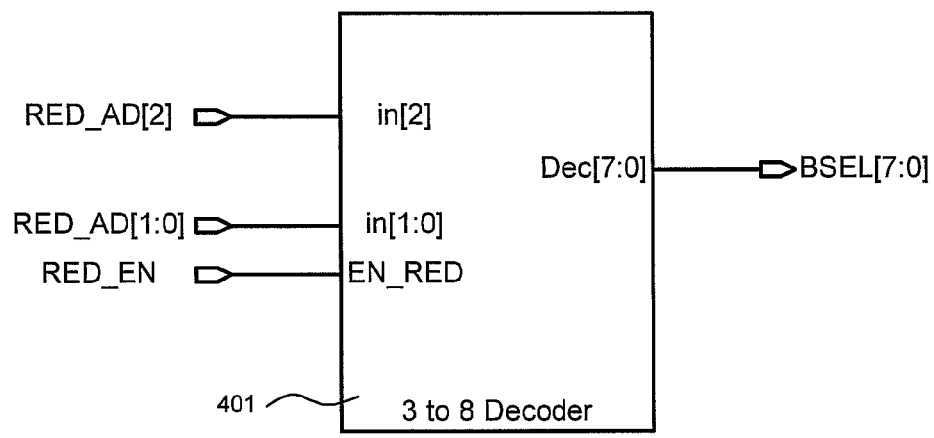
FIG. 4 is a circuit diagram showing a control circuit for outputting control signals BSEL[0] to BSEL[7] according to the embodiment of the present invention.

FIG. 4 is a circuit diagram showing a control circuit for outputting control signals BSEL[0] to BSEL[7] according to the embodiment of the present invention. As shown in FIG. 4, this control circuit is implemented by a three-to-eight decoding circuit 401, which includes three input pins in[2:0], an enable pin RED_EN and eight decoding pins Dec[7:0]. Similarly, it is assumed that a failed bit exists within the range of the 16$^{th}$ to 23$^{rd}$ bit lines BL[16:23], and the sub-block of the memory cell block is defined by an address number mentioned hereinabove. According to the above-mentioned assumption, when BL[16:23] are tested to have the failed bit, the failed block address number RED_AD[2:0] is set as 101 when it is shipped out. In addition, when the failed bit is found in the test, the failed bit enable signal RED_EN is set as enabled, and the input terminal of the decoding circuit 401 receives 101. At this time, the decoding pin Dec[5] of the decoding circuit 401 outputs the logic high voltage, and the other decoding pins Dec[0] to Dec[4] and Dec[6] to Dec[7] have the logic low voltages. Because the definition of the address number is mentioned hereinabove, the relationships between Dec[7:0] and the control signal BSEL[7:0] are listed in the following table.

| | |
|---|---|
| Dec[0] | BSEL[1] |
| Dec[1] | BSEL[3] |
| Dec[2] | BSEL[5] |
| Dec[3] | BSEL[7] |
| Dec[4] | BSEL[0] |

-continued

| | |
|---|---|
| Dec[5] | BSEL[2] |
| Dec[6] | BSEL[4] |
| Dec[7] | BSEL[6] |

According to the table, the above-mentioned design enables the control signal BSEL[2] to be the logic high voltage. Thus, the bus pin SB/IO3 of the second input-output port 106 is electrically connected to the eight-to-four multiplexer SMUX8-4, connected to the redundant block, through the eight-to-four multiplexer SEL8-4-3.

In the illustrated embodiment, each of the memory cell blocks I/O[0] to I/O[3] is divided into two memory cell sub-blocks. However, one of ordinary skill in the art may understand that the number of the memory cell sub-blocks is the design choice. In addition, the bandwidths of the first input-output port 105 and the second input-output port 106 may be modified according to different applications. Thus, the present invention is not limited thereto.

In summary, the spirit of the present invention is to utilize the redundant block to repair the failed bit, which may appear in the pseudo-dual port static random access memory having two input-output ports with different bandwidths in the driving circuit of the liquid crystal display. The present invention may utilize the fewer redundant column blocks and store a few failed block addresses to reduce the complexity of decoding the redundant block required in the redundant column block. Thus, the present invention can reduce the layout area for the redundant memory cells.

While the invention has been described by way of examples and in terms of preferred embodiments, it is to be understood that the invention is not limited thereto. To the contrary, it is intended to cover various modifications. Therefore, the scope of the appended claims should be accorded the broadest interpretation so as to encompass all such modifications.

What is claimed is:

1. A repairable pseudo-dual port static random access memory, comprising:
a memory cell array comprising a plurality of memory cell blocks and a redundant block, wherein each of the memory cell blocks is divided into a plurality of memory cell sub-blocks, and a size of the redundant block is the same as a size of the memory cell sub-blocks;
an address decoding circuit, comprising:
a row address decoding circuit for turning on a specific row of the memory cell array according to the specific row specified by a row address;
a first column address decoding circuit, having an N-bit connection bus, for electrically connecting N first specific columns of the memory cell array to the N-bit connection bus of the first column address decoding circuit according to the N first specific columns specified by a first column address signal, wherein N is a natural number; and
a second column address decoding circuit, having an M-bit connection bus, for electrically connecting M second specific columns of the memory cell array to the M-bit connection bus of the second column address decoding circuit according to the M second specific columns specified by a second column address signal, wherein M is a natural number and greater than N;
a first input-output port having an N-bit bus;
a second input-output port having an M-bit bus;
a first select circuit coupled to the N-bit connection bus of the first column address decoding circuit and the N-bit bus of the first input-output port, wherein when a first specific column specified by the first column address signal is in a failed memory cell sub-block, the first select circuit selects a first corresponding column of the redundant block, and connects the first corresponding column of the redundant block to the N-bit bus of the first input-output port, wherein a relative address of the first corresponding column is the same as an address of the first specific column in the failed memory cell sub-block; and
a second select circuit coupled to the M-bit connection bus of the second column address decoding circuit and the M-bit bus of the second input-output port, wherein when a second specific column specified by the second column address signal is in the failed memory cell sub-block, the second select circuit selects a second corresponding column of the redundant block, and couples the second corresponding column of the redundant block to the M-bit bus of the second input-output port, wherein a relative address of the second corresponding column is the same as an address of the second specific column in the failed memory cell sub-block.

2. The memory according to claim 1, wherein the memory cell array includes "a" memory cell blocks each comprising "b" sub-memory cell blocks, each of which comprises "c" column addresses, and the first column address decoding circuit comprises:
a×b first multiplexers each comprising "c" input terminals and "d" output terminals, wherein the "c" input terminals of the $(i \times j)^{th}$ first multiplexer are respectively coupled to "c" column addresses of the $j^{th}$ memory cell sub-block of the $i^{th}$ memory cell block; and
"a" second multiplexers each comprising b×d input terminals and "d" output terminals, wherein the $(p \times 1)^{th}$ to $(p \times d)^{th}$ input terminals of the $k^{th}$ second multiplexer are respectively coupled to the first to $d^{th}$ output terminals of the $(k \times p)^{th}$ first multiplexer,
wherein "a", "b", "c", "d", "i", "j", "k" and "p" are natural numbers; d×a=N; "i" and "k" range between 0 and "a"; "j" and "p" range between 0 and "b"; each of the first multiplexers selects "d" column addresses according to a first portion of the first column address signal so that the "d" column addresses are electrically connected to the "d" output terminals thereof; each of the second multiplexers selects a specific multiplexer from the "b" multiplexers coupled thereto according to a second portion of the first column address signal, and electrically connects the "d" output terminals of the specific multiplexer to the "d" output terminals thereof.

3. The memory according to claim 2, wherein the redundant block comprises "c" column addresses and the first select circuit comprises:
a third multiplexer, which comprises "c" input terminals and "d" output terminals, wherein the "c" input terminals of the third multiplexer are respectively coupled to the "c" column addresses of the redundant block, and the third multiplexer selects "d" column addresses according to the first portion of the first column address signal so that the "d" column addresses are electrically connected to the "d" output terminals thereof;
"a" fourth multiplexers each comprising a control input terminal, a first set of input terminals, a second set of input terminals and "d" output terminals, wherein the first set of input terminals and the second set of input terminals of the fourth multiplexer respectively comprise "d" input terminals, the first set of input terminals of the $u^{th}$ fourth multiplexer are coupled to the "d" output terminals of the $u^{th}$ second multiplexer, and the second set of input terminals of each of the fourth multiplexers are coupled to the "d" output terminals of the third multiplexer; and a first control circuit comprising "a" control output terminals respectively coupled to the control input terminals of the fourth multiplexers, wherein when the first specific column specified by the first column address signal is in the $y^{th}$ memory cell sub-block of the $v^{th}$ memory cell block and the $y^{th}$ memory cell sub-block of the $v^{th}$ memory cell block is the failed memory cell sub-block, the $v^{th}$ control output terminal of the first control circuit controls the $v^{th}$ fourth multiplexer so that the second set of input terminals of the $v^{th}$ fourth multiplexer are electrically connected to the "d" output terminals thereof, wherein "v" and "y" are natural numbers, and "v" ranges between 0 and "a", and "y" ranges between 0 and "b".

4. The memory according to claim 1, wherein the memory cell array comprises "a" memory cell blocks each comprising "b" sub-memory cell blocks, each of which comprises "c" column addresses, and the second column address decoding circuit comprises:

a×b fifth multiplexers each comprising "c" input terminals and "x" output terminals, wherein the "c" input terminals of the $(q \times r)^{th}$ fifth multiplexer are respectively coupled to the "c" column addresses of the $r^{th}$ memory cell sub-block of the $q^{th}$ memory cell block, wherein "a", "b", "c", "x", "q" and "r" are natural numbers; x×a×b=M; "q" ranges between 0 and "a"; "r" ranges between 0 and "b"; each of the fifth multiplexers selects "x" column addresses according to the second column address signal so that the "x" column addresses are electrically connected to the "x" output terminals thereof.

5. The memory according to claim 4, wherein the redundant block comprises "c" column addresses, and the second select circuit comprises:

a sixth multiplexer comprising "c" input terminals and "x" output terminals, wherein the "c" input terminals of the sixth multiplexer are respectively coupled to the "c" column addresses of the redundant block, and the sixth multiplexer selects "x" column address according to the second column address signal so that the "x" column addresses are electrically connected to the "x" output terminals thereof;

"a" seventh multiplexers each comprising a control input terminal, a first set of input terminals, a second set of input terminals and "x" output terminals, wherein the first set of input terminals and the second set of input terminals of the seventh multiplexer respectively comprise "x" input terminals, the first set of input terminals of the $u^{th}$ seventh multiplexer is coupled to the "x" output terminals of the $u^{th}$ fifth multiplexer, and the second set of input terminals of each of the seventh multiplexers is coupled to the "x" output terminals of the sixth multiplexer; and a second control circuit comprising "a" control output terminals respectively coupled to the control input terminals of the seventh multiplexers, wherein when the second specific column specified by the second column address signal is in the $z^{th}$ memory cell sub-block of the $w^{th}$ memory cell block and the $z^{th}$ memory cell sub-block of the $w^{th}$ memory cell block is in the failed memory cell sub-block, the $w^{th}$ control output terminal of the second control circuit controls the $w^{th}$ seventh multiplexer so that the second set of input terminals of the $w^{th}$ seventh multiplexer is electrically connected to the "x" output terminals of the $w^{th}$ seventh multiplexer, wherein "w" and "z" are natural numbers, "w" ranges between 0 and "a", and "z" ranges between 0 and "b".

6. A repair circuit of a pseudo-dual port static random access memory, wherein the pseudo-dual port static random access memory comprises:

a memory cell array comprising a plurality of memory cell blocks, wherein each of the memory cell blocks is divided into a plurality of memory cell sub-blocks;

an address decoding circuit, comprising:

a row address decoding circuit for turning on a specific row of the memory cell array according to the specific row specified by a row address;

a first column address decoding circuit, having an N-bit connection bus, for electrically connecting N first specific columns of the memory cell array to the N-bit connection bus of the first column address decoding circuit according to the N first specific columns specified by a first column address signal, wherein N is a natural number; and a second column address decoding circuit, having an M-bit connection bus, for electrically connecting M second specific columns of the memory cell array to the M-bit connection bus of the second column address decoding circuit according to the M second specific columns specified by a second column address signal, wherein M is a natural number and greater than N;

a first input-output port having an N-bit bus; and a second input-output port having an M-bit bus; and the memory repair circuit comprises:

a redundant block disposed in the memory cell array, wherein a size of the redundant block is the same as a size of the memory cell sub-blocks;

a first select circuit coupled to the N-bit connection bus of the first column address decoding circuit and the N-bit bus of the first input-output port, wherein when a first specific column specified by the first column address signal is in a failed memory cell sub-block, the first select circuit selects a first corresponding column of the redundant block, and connects the first corresponding column of the redundant block to the N-bit bus of the first input-output port, wherein a relative address of the first corresponding column is the same as an address of the first specific column in the failed memory cell sub-block; and a second select circuit coupled to the M-bit connection bus of the second column address decoding circuit and the M-bit bus of the second input-output port, wherein when a second specific column specified by the second column address signal is in the failed memory cell sub-block, the second select circuit selects a second corresponding column of the redundant block, and couples the second corresponding column of the redundant block to the M-bit bus of the second input-output port, wherein a relative address of the second corresponding column is the same as an address of the second specific column in the failed memory cell sub-block.

7. The repair circuit according to claim 6, wherein the memory cell array includes "a" memory cell blocks each comprising "b" sub-memory cell blocks, each of which comprises "c" column addresses, and the first column address decoding circuit comprises:

a×b first multiplexers each comprising "c" input terminals and "d" output terminals, wherein the "c" input terminals of the $(i \times j)^{th}$ first multiplexer are respectively coupled to "c" column addresses of the $j^{th}$ memory cell sub-block of the $i^{th}$ memory cell block; and "a" second multiplexers each comprising b×d input terminals and "d" output terminals, wherein the $(p\times1)^{th}$ to $(p\times d)^{th}$ input terminals of the $k^{th}$ second multiplexer are respectively coupled to the first to $d^{th}$ output terminals of the $(k\times p)^{th}$ first multiplexer, wherein "a", "b", "c", "d", "i", "j", "k" and "p" are natural numbers; d×a=N; "i" and "k" range between 0 and "a"; "j" and "p" range between 0 and "b"; each of the first multiplexers selects "d" column addresses according to a first portion of the first column address signal so that the "d" column addresses are electrically connected to the "d" output terminals thereof; each of the second multiplexers selects a specific multiplexer from the "b" multiplexers coupled thereto according to a second portion of the first column address signal, and electrically connects the "d" output terminals of the specific multiplexer to the "d" output terminals thereof.

8. The repair circuit according to claim 7, wherein the redundant block comprises "c" column addresses and the first select circuit comprises:

a third multiplexer, which comprises "c" input terminals and "d" output terminals, wherein the "c" input terminals of the third multiplexer are respectively coupled to the "c" column addresses of the redundant block, and the third multiplexer selects "d" column addresses according to the first portion of the first column address signal so that the "d" column addresses are electrically connected to the "d" output terminals thereof;

"a" fourth multiplexers each comprising a control input terminal, a first set of input terminals, a second set of input terminals and "d" output terminals, wherein the first set of input terminals and the second set of input terminals of the fourth multiplexer respectively comprise "d" input terminals, the first set of input terminals of the $u^{th}$ fourth multiplexer are coupled to the "d" output terminals of the $u^{th}$ second multiplexer, and the second set of input terminals of each of the fourth multiplexers are coupled to the "d" output terminals of the third multiplexer; and a first control circuit comprising "a" control output terminals respectively coupled to the control input terminals of the fourth multiplexers, wherein when the first specific column specified by the first column address signal is in the $y^{th}$ memory cell sub-block of the $v^{th}$ memory cell block and the $y^{th}$ memory cell sub-block of the $v^{th}$ memory cell block is the failed memory cell sub-block, the $v^{th}$ control output terminal of the first control circuit controls the $v^{th}$ fourth multiplexer so that the second set of input terminals of the $v^{th}$ fourth multiplexer are electrically connected to the "d" output terminals thereof, wherein "v" and "y" are natural numbers, and "v" ranges between 0 and "a", and "y" ranges between 0 and "b".

9. The repair circuit according to claim 6, wherein the memory cell array comprises "a" memory cell blocks each comprising "b" sub-memory cell blocks, each of which comprises "c" column addresses, and the second column address decoding circuit comprises:

a×b fifth multiplexers each comprising "c" input terminals and "x" output terminals, wherein the "c" input terminals of the $(q\times r)^{th}$ fifth multiplexer are respectively coupled to the "c" column addresses of the $r^{th}$ memory cell sub-block of the $q^{th}$ memory cell block, wherein "a", "b", "c", "x", "q" and "r" are natural numbers; x×a×b=M; "q" ranges between 0 and "a"; "r" ranges between 0 and "b"; each of the fifth multiplexers selects "x" column addresses according to the second column address signal so that the "x" column addresses are electrically connected to the "x" output terminals thereof.

10. The repair circuit according to claim 9, wherein the redundant block comprises "c" column addresses, and the second select circuit comprises:

a sixth multiplexer comprising "c" input terminals and "x" output terminals, wherein the "c" input terminals of the sixth multiplexer are respectively coupled to the "c" column addresses of the redundant block, and the sixth multiplexer selects "x" column address according to the second column address signal so that the "x" column addresses are electrically connected to the "x" output terminals thereof;

"a" seventh multiplexers each comprising a control input terminal, a first set of input terminals, a second set of input terminals and "x" output terminals, wherein the first set of input terminals and the second set of input terminals of the seventh multiplexer respectively comprise "x" input terminals, the first set of input terminals of the $u^{th}$ seventh multiplexer is coupled to the "x" output terminals of the $u^{th}$ fifth multiplexer, and the second set of input terminals of each of the seventh multiplexers is coupled to the "x" output terminals of the sixth multiplexer; and a second control circuit comprising "a" control output terminals respectively coupled to the control input terminals of the seventh multiplexers, wherein when the second specific column specified by the second column address signal is in the $z^{th}$ memory cell sub-block of the $w^{th}$ memory cell block and the $z^{th}$ memory cell sub-block of the $w^{th}$ memory cell block is in the failed memory cell sub-block, the $w^{th}$ control output terminal of the second control circuit controls the $w^{th}$ seventh multiplexer so that the second set of input terminals of the $w^{th}$ seventh multiplexer is electrically connected to the "x" output terminals of the $w^{th}$ seventh multiplexer, wherein "w" and "z" are natural numbers, "w" ranges between 0 and "a", and "z" ranges between 0 and "b".

* * * * *